(12) United States Patent
Ikeda et al.

(10) Patent No.: US 11,810,886 B2
(45) Date of Patent: Nov. 7, 2023

(54) DISPLAY DEVICE

(71) Applicant: Japan Display Inc., Tokyo (JP)

(72) Inventors: Masanobu Ikeda, Tokyo (JP); Osamu Itou, Tokyo (JP); Yasuhiro Kanaya, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 261 days.

(21) Appl. No.: 17/460,307

(22) Filed: Aug. 30, 2021

(65) Prior Publication Data

US 2021/0391293 A1   Dec. 16, 2021

Related U.S. Application Data

(63) Continuation of application No. PCT/JP2019/051032, filed on Dec. 25, 2019.

(30) Foreign Application Priority Data

Mar. 1, 2019   (JP) .................................. 2019-037721

(51) Int. Cl.
   *H01L 23/00*   (2006.01)
   *H01L 25/16*   (2023.01)

(52) U.S. Cl.
   CPC .............. *H01L 24/29* (2013.01); *H01L 24/32* (2013.01); *H01L 25/167* (2013.01); *H01L 24/83* (2013.01);
   (Continued)

(58) Field of Classification Search
   CPC ... G09F 9/30; G09F 9/33; H01L 33/62; H01L 24/32; H01L 25/167; H01L 24/29; H01L 24/83; H01L 25/162; H01L 33/00; H01L 33/22; H01L 27/088; H01L 25/0753; H01L 21/02381; H01L 27/156; H01L 33/38; H01L 24/27; H01L 24/05; H01L 24/14; H01L 33/50; H01L 33/60; H01L 33/504;
   (Continued)

(56) References Cited

U.S. PATENT DOCUMENTS

10,021,762 B1 * 7/2018 Tsai .................... H01L 33/22
2012/0107628 A1   5/2012 Komatsu et al.
(Continued)

FOREIGN PATENT DOCUMENTS

JP   2011-21255 A    2/2011
JP   2016-512347 A   4/2016
(Continued)

OTHER PUBLICATIONS

Office Action dated Jan. 4, 2023 in Japanese Patent Application No. 2019-037721, 8 pages.
(Continued)

*Primary Examiner* — Mouloucoulaye Inoussa
(74) *Attorney, Agent, or Firm* — XSENSUS LLP

(57) ABSTRACT

A display device includes a substrate; a plurality of pixels on the substrate; a light emitting element in each of the plurality of pixels; a first electrode electrically coupled with the light emitting element; a transistor on the substrate and electrically coupled with the first electrode; and a coupling layer between the first electrode and the light emitting element in a direction perpendicular to the substrate and containing a plurality of first conductive nanoparticles.

14 Claims, 11 Drawing Sheets

(52) U.S. Cl.
CPC ... *H01L 25/162* (2013.01); *H01L 2224/29011* (2013.01); *H01L 2224/29339* (2013.01); *H01L 2224/32505* (2013.01); *H01L 2224/8384* (2013.01); *H01L 2924/351* (2013.01)

(58) Field of Classification Search
CPC ... H01L 2224/8384; H01L 2224/29339; H01L 2224/32505; H01L 2924/351; H01L 2224/29011; H01L 2224/04026; H01L 2924/12041; H01L 2924/10253; H01L 2933/0091; H01L 2224/05644; H01L 2224/29499; H01L 2224/29455; H01L 2224/83856; H01L 2224/05681; H01L 2224/0568; H01L 2224/05655; H01L 2224/29447; G02F 1/13454; G02F 1/13452; G02F 3/167; G02F 1/1677; G02F 1/133553; G02F 1/136227; G02F 1/133512; G02F 1/133514; G02F 1/167; G02F 1/157; G02F 5/02; G02F 1/1675; G02F 1/1681; G02F 1/13338; G02F 2001/1678; G02F 2201/34; H10K 71/00; H10K 50/854; H10K 59/1213; H10K 59/179; H10K 77/111; H10K 50/81; H10K 59/124; H10K 59/1201; H10K 59/12; H10K 50/856; H10K 59/122; H10K 59/38; H10K 59/35; H10K 2102/351; H10K 2102/311; H10K 2102/331; H05B 33/22; G09G 3/32; G09G 3/3446; G09G 2300/0426; G09G 2310/0262; G09G 2300/06; G09G 2300/0809; G06F 3/0412; G06F 3/0445; G06F 3/0446; G06F 3/041662; G06F 3/0447; G02B 5/0808; G02B 5/02; Y10S 977/952; Y10S 977/824; Y10S 977/774
USPC .................. 348/87; 359/296; 345/107, 174
See application file for complete search history.

(56) References Cited

U.S. PATENT DOCUMENTS

| 2013/0001774 | A1 | 1/2013 | Masumori et al. |
| 2014/0267683 | A1* | 9/2014 | Bibl ................ H10K 50/00 348/87 |
| 2015/0255505 | A1* | 9/2015 | Jeoung ............... H05K 1/189 257/89 |
| 2017/0213502 | A1 | 7/2017 | Henry et al. |
| 2020/0126477 | A1 | 4/2020 | Henry et al. |

FOREIGN PATENT DOCUMENTS

| JP | 2017-529557 A | 10/2017 |
| WO | 2011/114747 A1 | 9/2011 |
| WO | 2014/002949 A1 | 1/2014 |

OTHER PUBLICATIONS

International Search Report and Written Opinion dated Mar. 17, 2020, received for PCT Application PCT/JP2019/051032, Filed on Dec. 25, 2019, 12 pages including English Translation.

* cited by examiner

DISPLAY DEVICE

CROSS-REFERENCE TO RELATED APPLICATIONS

This application is a continuation of PCT Application No. PCT/JP2019/051032, filed Dec. 25, 2019, and based upon and claiming the benefit of priority from Japanese Patent Application No. 2019-037721, filed Mar. 1, 2019, the entire contents of all of which are incorporated herein by reference.

BACKGROUND

1. Technical Field

What is disclosed herein relates to a display device.

2. Description of the Related Art

Recently, a display for which a minute light emitting diode (micro LED) is used as a display element has been attracting attention (refer to Japanese Laid-open Patent Publication (Translation of PCT Application) No. 2017-529557, for example). A plurality of light emitting diodes are each coupled with an electrode on an array substrate through a coupling member such as solder.

Each light emitting diode is coupled on the array substrate by thermal compression bonding. Thus, residual stress remains at a coupling part between the light emitting diode and the array substrate after cooling. Furthermore, the coupling area of the light emitting diode reduces along with downsizing of the light emitting diode, and thus coupling reliability may decrease because of the residual stress.

SUMMARY

A display device according to one aspect of the present disclosure includes a substrate; a plurality of pixels on the substrate; a light emitting element in each of the plurality of pixels; a first electrode electrically coupled with the light emitting element; a transistor on the substrate and electrically coupled with the first electrode; and a coupling layer between the first electrode and the light emitting element in a direction perpendicular to the substrate and containing a plurality of first conductive nanoparticles.

DETAILED DESCRIPTION

Aspects (embodiments) of the present disclosure will be described below in detail with reference to the accompanying drawings. The present disclosure is not limited by contents described below in the embodiments. Components described below include those that could be easily thought of by the skilled person in the art and those identical in effect. Components described below may be combined as appropriate. What is disclosed herein is merely exemplary, and the scope of the present disclosure includes any modification that could be easily thought of by the skilled person in the art as appropriate without departing from the scope of the disclosure. For clearer description, the drawings are schematically illustrated for the width, the thickness, the shape, and the like of each component as compared to actual aspects thereof in some cases, but they are merely exemplary and do not limit interpretation of the present disclosure. In the present specification and the drawings, any element same as that already described with reference to an already described drawing is denoted by the same reference sign, and detailed description thereof is omitted as appropriate.

In the present specification and the claims, when an aspect that one structural body is disposed on another structural body is expressed by simply using "on", the aspect includes both a configuration in which the one structural body is disposed right above the other structural body in contact and a configuration in which the one structural body is disposed above the other structural body with another structural body interposed therebetween, unless otherwise stated.

First Embodiment

Figure 1:
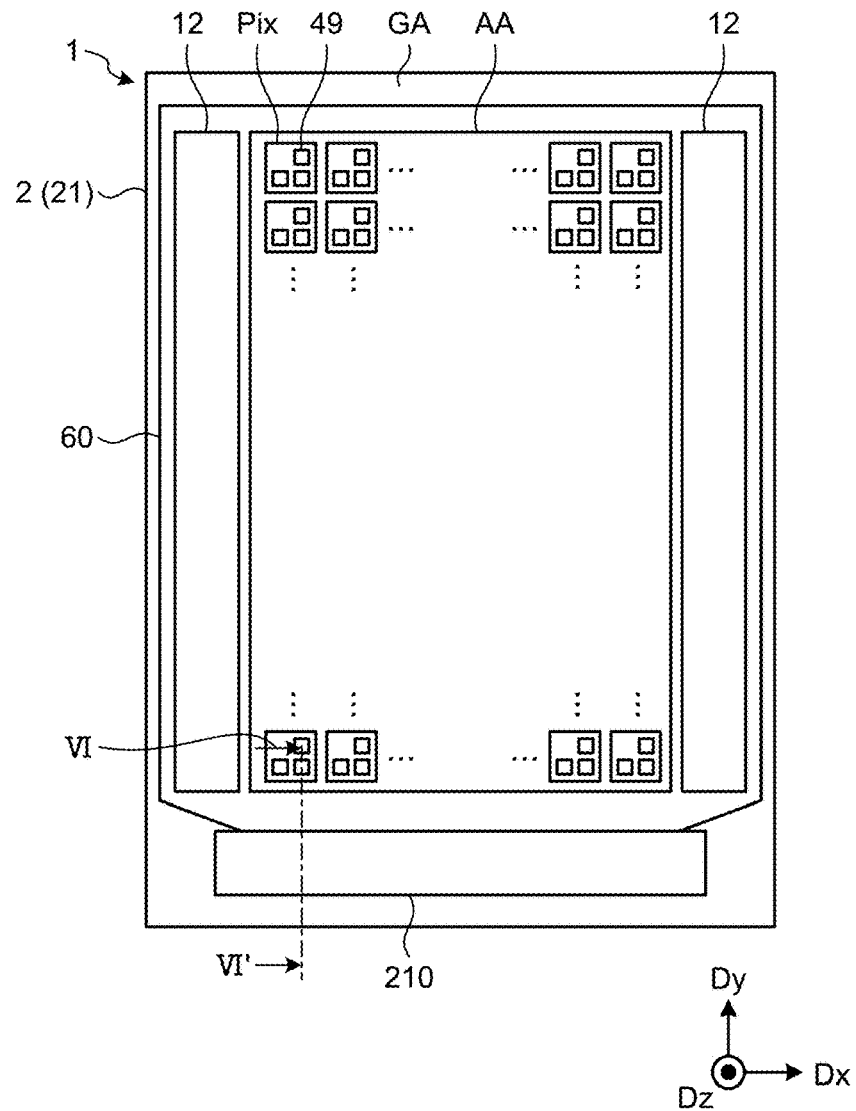
FIG. 1 is a plan view schematically illustrating a display device according to a first embodiment.

FIG. 1 is a plan view schematically illustrating a display device according to a first embodiment. As illustrated in FIG. 1, this display device 1 includes an array substrate 2, pixels Pix, a drive circuit 12, a drive integrated circuit (IC) 210, and a cathode wire 60. The array substrate 2 is a drive circuit substrate for driving each of the pixels Pix and also referred to as a back plane or an active matrix substrate. The array substrate 2 includes a substrate 21, a plurality of transistors, a plurality of capacitors, and various wires.

As illustrated in FIG. 1, the display device 1 includes a display region AA and a peripheral region GA. The display region AA is a region that overlaps the pixels Pix and displays an image therein. The peripheral region GA is a region that does not overlap the pixels Pix and is disposed outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. However, the first direction Dx may intersect the second direction Dy instead of being orthogonal thereto. A third direction Dz is orthogonal to the first direction Dx and the second direction Dy. The third direction Dz corresponds to, for example, the normal direction of the substrate 21. Hereinafter, a plan view illustrates a positional relation when viewed in the third direction Dz.

The drive circuit 12 is a circuit configured to drive a plurality of gate lines (for example, a light emission control scanning line BG, a reset control scanning line RG, a correction control scanning line CG, an initialization control scanning line IG, and a write control scanning line SG (refer to FIG. 3)) based on various kinds of control signals from the drive IC 210. The drive circuit 12 sequentially or simultaneously selects the gate lines and supplies a gate drive signal to each of the selected gate lines. Accordingly, the drive circuit 12 selects a plurality of pixels Pix coupled with the gate line.

The drive IC 210 is a circuit configured to control display of the display device 1. The drive IC 210 is mounted as a chip on glass (COG) in the peripheral region GA of the substrate 21. Instead, the drive IC 210 may be mounted as a chip on film (COF) on a flexible printed board or rigid substrate coupled with the peripheral region GA of the substrate 21.

The cathode wire 60 is provided in the peripheral region GA of the substrate 21. The cathode wire 60 surrounds the pixels Pix in the display region AA and the drive circuit 12 in the peripheral region GA. The cathodes of a plurality of light emitting elements 3 are electrically coupled with the cathode wire 60 in common and supplied with fixed potential (for example, ground potential). More specifically, a cathode terminal 32 (refer to FIG. 5) of each of the light emitting elements 3 is coupled with the cathode wire 60 through a cathode electrode 22 (second electrode).

Figure 2:
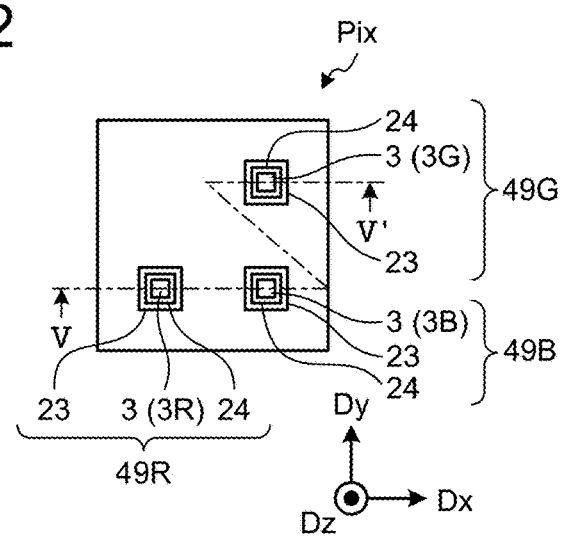
FIG. 2 is a plan view illustrating each of a plurality of pixels.

FIG. 2 is a plan view illustrating each of the pixels. As illustrated in FIG. 2, each of the pixels Pix includes a plurality of sub pixels 49. For example, each of the pixels Pix includes a first sub pixel 49R, a second sub pixel 49G, and a third sub pixel 49B. The first sub pixel 49R displays a primary color of red as a first color. The second sub pixel 49G displays a primary color of green as a second color. The third sub pixel 49B displays a primary color of blue as a third color. As illustrated in FIG. 2, in each of the pixels Pix, the first sub pixel 49R and the third sub pixel 49B are adjacent to each other in the first direction Dx. The second sub pixel 49G and the third sub pixel 49B are adjacent to each other in the second direction Dy. The first color, the second color, and the third color are not limited to red, green, and blue, respectively, but may be selected to be optional colors such as complementary colors. Hereinafter, the first sub pixel 49R, the second sub pixel 49G, and the third sub pixel 49B are referred to as the sub pixels 49 when not needed to be distinguished from one another.

Each sub pixel 49 includes the corresponding light emitting element 3, an anode electrode 23 (first electrode), and a coupling layer 24. The display device 1 displays an image by emitting light beams of different kinds (for example, light in red, green, and blue colors) from light emitting elements 3R, 3G, and 3B at the first sub pixel 49R, the second sub pixel 49G, and the third sub pixel 49B. The light emitting elements 3 are provided at the respective sub pixels 49. Each light emitting element 3 is a light emitting diode (LED) chip having a size of 3 μm to 300 μm inclusive approximately in a plan view and referred to as a micro LED. The display device 1 including the micro LED at each of the pixels is also referred to as a micro LED display device. The term "micro" in "micro LED" does not limit the size of the light emitting element 3.

The light emitting elements 3 may emit light beams of four or more colors. Disposition of the sub pixels 49 is not limited to the configuration illustrated in FIG. 2. For example, the first sub pixel 49R may be adjacent to the second sub pixel 49G in the first direction Dx. The first sub pixel 49R, the second sub pixel 49G, and the third sub pixel 49B may be repeatedly arrayed in the stated order in the first direction Dx.

Figure 3:
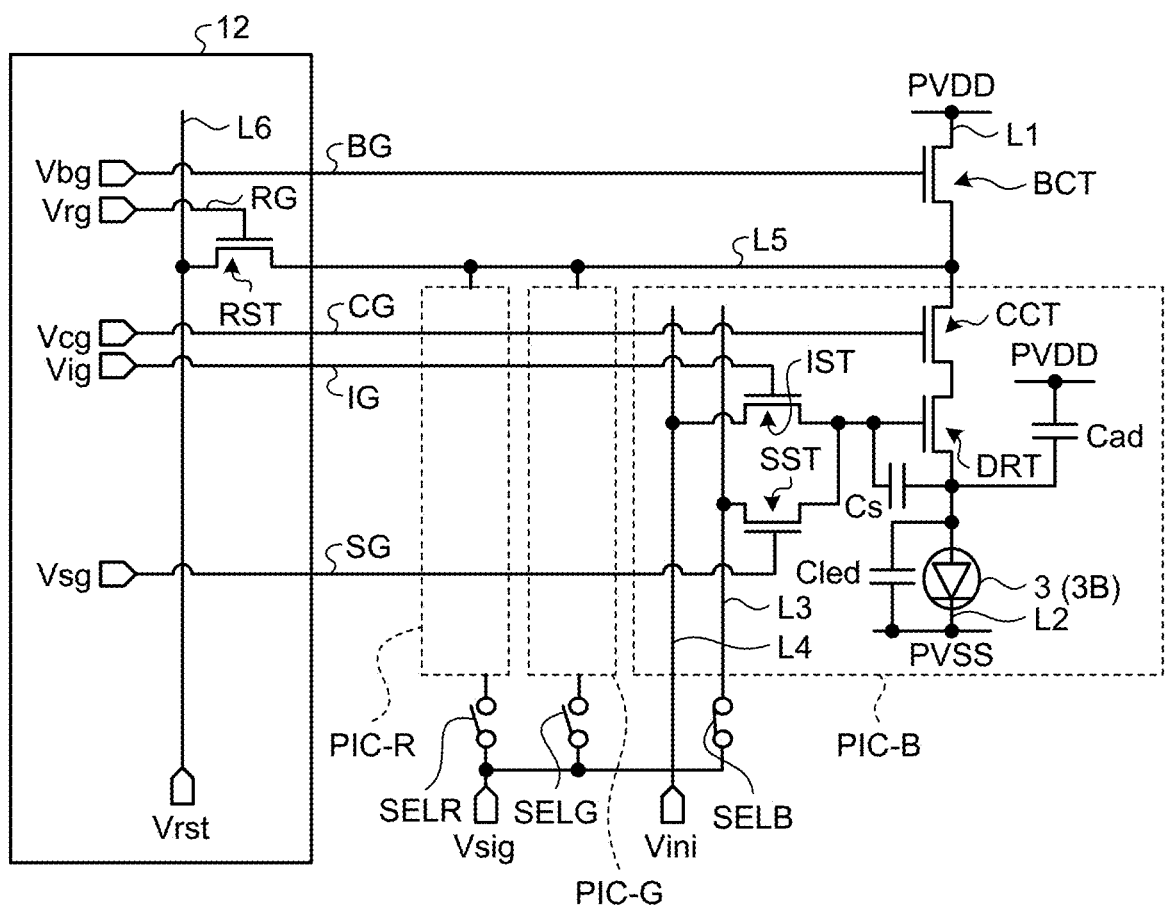
FIG. 3 is a circuit diagram illustrating pixel circuits.

FIG. 3 is a circuit diagram illustrating pixel circuits. Pixel circuits PIC-R, PIC-G, and PIC-B illustrated in FIG. 3 are provided corresponding to the first sub pixel 49R, the second sub pixel 49G, and the third sub pixel 49B, respectively. FIG. 3 illustrates a circuit diagram of the pixel circuit PIC-B and omits illustrations of the pixel circuits PIC-R and PIC-G, but description of the pixel circuit PIC-B is also applicable to the pixel circuits PIC-R and PIC-G.

As illustrated in FIG. 3, the pixel circuit PIC-B includes the corresponding light emitting element 3, five transistors, and three capacitors. Specifically, the pixel circuit PIC-B includes a light emission control transistor BCT, a correction transistor CCT, an initialization transistor IST, a write transistor SST, and a drive transistor DRT. Any transistor may be shared by a plurality of sub pixels 49 adjacent to each other. In the example illustrated in FIG. 3, the light emission control transistor BCT is shared by three sub pixels 49 through a common wire L5. One reset transistor RST is provided for, for example, each row of sub pixels 49 in the peripheral region GA. The drain of the reset transistor RST is coupled with a plurality of pixel circuits PIC-R, PIC-G, and PIC-B through the common wire L5.

The light emission control transistor BCT, the correction transistor CCT, the initialization transistor IST, the write transistor SST, the drive transistor DRT, and the reset transistor RST are each configured as an n-type thin film transistor (TFT). However, the present disclosure is not limited thereto, but each of the transistors may be configured as a p-type TFT. When the p-type TFT is used, power potential and coupling of a holding capacitor Cs may be adapted as appropriate.

The light emission control scanning line BG is coupled with the gate of the light emission control transistor BCT. The reset control scanning line RG is coupled with the gate of the reset transistor RST. The correction control scanning line CG is coupled with the gate of the correction transistor CCT. The initialization control scanning line IG is coupled with the gate of the initialization transistor IST. The write control scanning line SG is coupled with the gate of the write transistor SST.

The light emission control scanning line BG, the reset control scanning line RG, the correction control scanning line CG, the initialization control scanning line IG, and the write control scanning line SG are each coupled with the drive circuit 12 provided in the peripheral region GA. The drive circuit 12 respectively supplies a light emission control signal Vbg to the light emission control scanning line BG, a reset control signal Vrg to the reset control scanning line RG, a correction control signal Vcg to the correction control scanning line CG, an initialization control signal Vig to the initialization control scanning line IG, and a write control signal Vsg to the write control scanning line SG.

An image signal Vsig is supplied to the pixel circuits PIC-R, PIC-G, and PIC-B through switch elements SELR, SELG, and SELB. The drive IC 210 (refer to FIG. 1) supplies the image signal Vsig to the pixel circuits PIC-R, PIC-G, and PIC-B in a time divisional manner by outputting control signals to the switch elements SELR, SELG, and SELB. The image signal Vsig is supplied to the write transistor SST through an image signal line L3. The drive IC 210 also supplies initialization potential Vini to the initialization transistor IST through an initialization signal line L4. The drive circuit 12 also supplies reset power potential Vrst to the reset transistor RST through a reset signal line L6.

The light emission control transistor BCT, the correction transistor CCT, the initialization transistor IST, the write transistor SST, and the reset transistor RST function as a switching element that selects conduction or non-conduction between two nodes. The drive transistor DRT functions, in accordance with voltage between the gate and the drain, as a current control element configured to control current flowing to the light emitting element 3.

The cathode (cathode terminal 32) of the light emitting element 3 is coupled with a cathode power source line L2. The anode (anode terminal 33) of the light emitting element 3 is coupled with an anode power source line L1 through the drive transistor DRT, the correction transistor CCT, and the light emission control transistor BCT. Anode power potential PVDD is supplied to the anode power source line L1. Cathode power potential PVSS is supplied to the cathode power source line L2 through the cathode wire 60 and the cathode electrode 22. The anode power potential PVDD is higher than the cathode power potential PVSS. Light emission operation of the light emitting element 3 will be described later.

The pixel circuit PIC-B includes the holding capacitor Cs and capacitors Cled and Cad. The holding capacitor Cs is a capacitor formed between the gate and the source of the drive transistor DRT. The capacitor Cled is a parasitic capacitor formed between the anode and the cathode of the light emitting element 3. The capacitor Cad is an additional capacitor formed between the anode power source line L1 and each of the source of the drive transistor DRT and the anode of the light emitting element 3.

Figure 4:
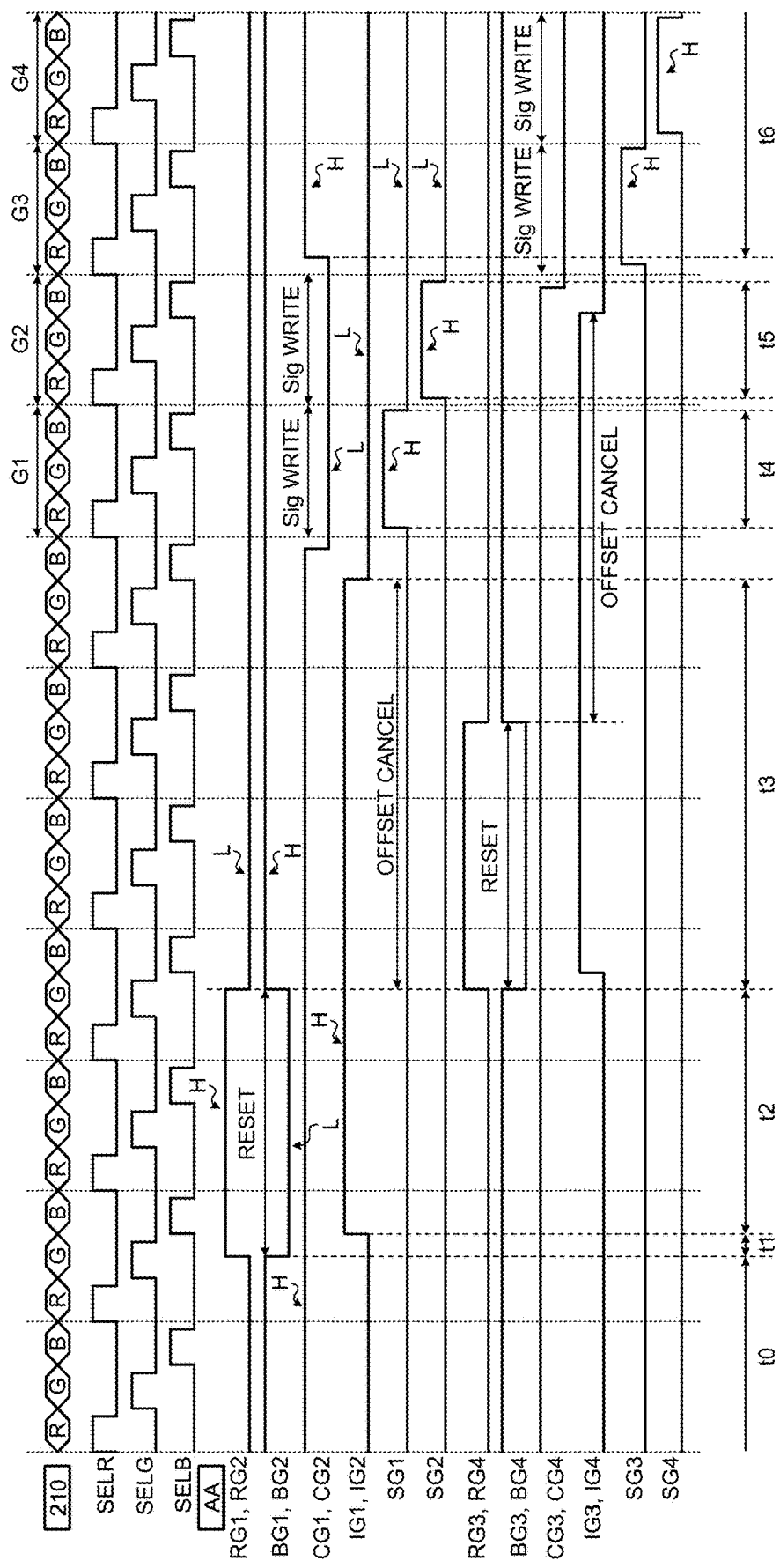
FIG. 4 is a timing chart illustrating exemplary operation of the display device.

FIG. 4 is a timing chart illustrating exemplary operation of the display device. Each of durations G1 to G4 illustrated in FIG. 4 is one horizontal duration. The operation drives only the sub pixels 49 on the first to the fourth rows in FIG. 4 but continuously drives the sub pixels 49 from the fifth row to the last row as well. In the following description, a duration in which the sub pixels 49 on the first to the last rows are driven is referred to as a frame duration.

Exemplary operation in durations t0 to t6 illustrated in FIG. 4 will be described below in detail. Duration t0 is the duration of light emission of the previous frame. Specifically, in duration t0 until processing is started in a frame duration, the sub pixels 49 remain in a light emission state of the previous frame.

Duration t1 is the duration of source initialization of the drive transistor DRT. Specifically, in duration t1, in response to control signals supplied from the drive circuit 12, the potential of light emission control scanning lines BG1 and BG2 goes to a low ("L") level, the potential of correction control scanning lines CG1 and CG2 goes to a high (H) level, and the potential of reset control scanning lines RG1 and RG2 to the "H" level. Accordingly, the light emission control transistor BCT is turned off (non-conduction state), and the correction transistor CCT and the reset transistor RST are turned on (conduction state).

The light emission control scanning line BG1 is a light emission control scanning line BG coupled with the sub pixels 49 on the first row, and the light emission control scanning line BG2 is a light emission control scanning line BG coupled with the sub pixels 49 on the second row. A light emission control scanning line BG3 is a light emission control scanning line BG coupled with the sub pixels 49 on the third row, and a light emission control scanning line BG4 is a light emission control scanning line BG coupled with the sub pixels 49 on the fourth row. The same configuration applies to scanning lines such as the correction control scanning lines CG1 and CG2 and the reset control scanning lines RG1 and RG2.

In duration t1, current from the anode power source line L1 is cut off by the light emission control transistor BCT at each of the sub pixels 49 belonging to the first and the second rows. Light emission from the light emitting element 3 stops, and electric charge remaining in the sub pixel 49 flows to the outside through the reset transistor RST. Accordingly, the source of the drive transistor DRT is fixed to the reset power potential Vrst. The reset power potential Vrst is set to have a predetermined potential difference from the cathode power potential PVSS. In this case, the potential difference between the reset power potential Vrst and the cathode power potential PVSS is smaller than a potential difference at which the light emitting element 3 starts light emission.

Duration t2 is the duration of gate initialization of the drive transistor DRT. Specifically, in duration t2, in response to control signals supplied from the drive circuit 12, the potential of initialization control scanning lines IG1 and IG2 goes to the "H" level. The initialization transistor IST is turned on. In each of the sub pixels 49 belonging to the first and second rows, the gate of the drive transistor DRT is fixed to the initialization potential Vini through the initialization transistor IST. The initialization potential Vini is higher than the reset power potential Vrst by potential larger than a threshold value for the drive transistor DRT. Accordingly, the drive transistor DRT is turned on. However, in duration t2, no current flows to the drive transistor DRT since the light emission control transistor BCT remains off.

Duration t3 is the duration of offset cancel operation. Specifically, in duration t3, in response to control signals supplied from the drive circuit 12, the potential of the light emission control scanning lines BG1 and BG2 goes to the "H" level, and the potential of the reset control scanning lines RG1 and RG2 to the "L" level. Accordingly, the light emission control transistor BCT is turned on, and the reset transistor RST is turned off.

The drive transistor DRT is turned on through the operation in duration t2. Accordingly, current is supplied from the anode power source line L1 (anode power potential PVDD) to the drive transistor DRT through the light emission control transistor BCT and the correction transistor CCT.

At this stage, voltage between the anode and the cathode of the light emitting element 3 is lower than light emission start voltage, and thus no current flows. Accordingly, the source of the drive transistor DRT is charged by the anode power potential PVDD and the potential of the source increases. The gate potential of the drive transistor DRT is at the initialization potential Vini. Accordingly, at a timing when the source potential of the drive transistor DRT becomes equal to "Vini–Vth", the drive transistor DRT is turned off and the potential increase stops. The term Vth represents a threshold value voltage Vth of the drive transistor DRT.

The threshold value voltage Vth varies among the sub pixels 49. Accordingly, the source potential of the drive transistor DRT when the potential increase stops is different among the sub pixels 49. Thus, each of the sub pixels 49 acquires voltage corresponding to the threshold value voltage Vth of the drive transistor DRT through the operation in duration t3. In this case, voltage "(Vini–Vth)–PVSS" is applied to the light emitting element 3. This voltage is lower than the light emission start voltage for the light emitting element 3, and thus no current flows to the light emitting element 3.

In the exemplary operation illustrated in FIG. 4, the sub pixels 49 on each two rows are simultaneously driven in durations t1 to t3, but the present disclosure is not limited thereto. The drive circuit 12 may drive the sub pixels 49 on each row or may simultaneously drive the sub pixels 49 on each three rows.

Durations t4 and t5 are each the duration of image signal write operation. Specifically, in duration t4, in response to control signals supplied from the drive circuit 12, the potential of the correction control scanning lines CG1 and CG2 goes to the "L" level, the potential of the initialization control scanning lines IG1 and IG2 to the "L" level, and a write control scanning line SG1 to the "H" level. In duration t5, in response to control signals supplied from the drive circuit 12, the potential of the correction control scanning lines CG1 and CG2 goes to the "L" level, the potential of the initialization control scanning lines IG1 and IG2 to the "L" level, and a write control scanning line SG2 to the "H" level.

Accordingly, the correction transistor CCT is turned off, the initialization transistor IST is turned off, and the write transistor SST is turned on. In duration t4, the image signal Vsig is input to the gate of the drive transistor DRT at each of the sub pixels 49 belonging to the first row. The gate potential of the drive transistor DRT changes from the initialization potential Vini to the potential of the image signal Vsig. The source potential of the drive transistor DRT remains at "Vini–Vth". As a result, voltage between the gate and the source of the drive transistor DRT becomes "Vsig–(Vini–Vth)", reflecting variance of the threshold value voltage Vth among the sub pixels 49.

Similarly, in duration t5, the image signal Vsig is input to the gate of the drive transistor DRT at each of the sub pixels 49 belonging to the second row, and voltage between the gate and the source of the drive transistor DRT becomes "Vsig–(Vini–Vth)".

The image signal line L3 extends in the second direction Dy (refer to FIG. 1) and is coupled with the sub pixels 49 arranged on a plurality of rows and belonging to the same column. Thus, durations t4 and t5 in which video write operation is performed are executed for each row.

Duration t6 is the duration of light emission operation. Specifically, in duration t6, in response to control signals supplied from the drive circuit 12, the potential of the correction control scanning lines CG1 and CG2 goes to the "H" level and the write control scanning lines SG1 and SG2 to the "L" level. Accordingly, the correction transistor CCT is turned on, and the write transistor SST is turned off. Current is supplied from the anode power source line L1 (anode power potential PVDD) to the drive transistor DRT through the light emission control transistor BCT and the correction transistor CCT.

The drive transistor DRT supplies, to the light emitting element 3, current in accordance with voltage between the gate and the source of the drive transistor DRT, which is set until duration t5. The light emitting element 3 emits light at luminance in accordance with the current. In this case, voltage between the anode and the cathode of the light emitting element 3 is voltage in accordance with the value of the current supplied through the drive transistor DRT. Accordingly, the potential of the anode of the light emitting element 3 increases. Voltage between the gate and the source of the drive transistor DRT is held by the holding capacitor Cs. Accordingly, the gate potential of the drive transistor DRT increases due to coupling of the holding capacitor Cs as the potential of the anode of the light emitting element 3 increases.

In reality, in addition to the holding capacitor Cs, an additional capacitor such as the capacitor Cad exists at the gate of the drive transistor DRT, and accordingly, the increase of the gate potential of the drive transistor DRT is slightly smaller than the anode potential increase. This value is known, and thus the potential of the image signal Vsig can be determined so that a desired current value is obtained at definitive voltage between the gate and the source of the drive transistor DRT.

When the above-described operation is completed from the first row to the last row, an image of one frame is displayed. For example, reset operation of the sub pixels 49 belonging to the third and the fourth rows is executed in a duration overlapping with duration t3. Offset cancel operation of the sub pixels 49 belonging to the third and fourth rows is executed in a duration overlapping with durations t3 to t5. Image signal write operation of the sub pixels 49 belonging to the third and fourth rows is executed in a duration overlapping with duration t6. Subsequently, such operations are repeated to perform video display.

The above-described configuration of each of the pixel circuits PIC illustrated in FIG. 3 and the above-described exemplary operation illustrated in FIG. 4 are merely exemplary and may be changed as appropriate. For example, the number of wires and the number of transistors at one sub pixel 49 may be other numbers. The pixel circuit PIC may employ the configuration of a current mirror circuit or the like.

Figure 5:
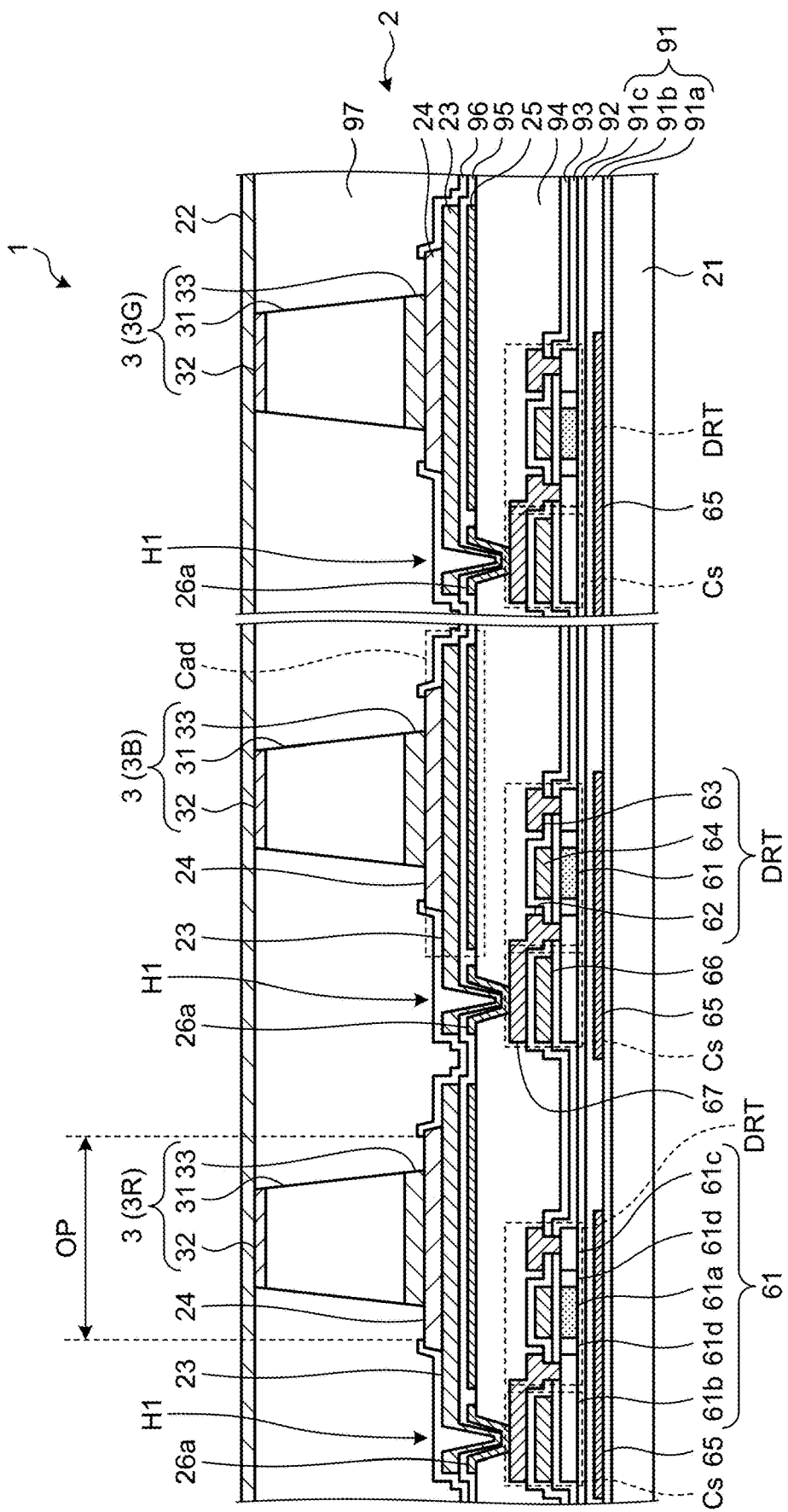
FIG. 5 is a cross-sectional view taken along line V-V' in FIG. 2.
Figure 6:
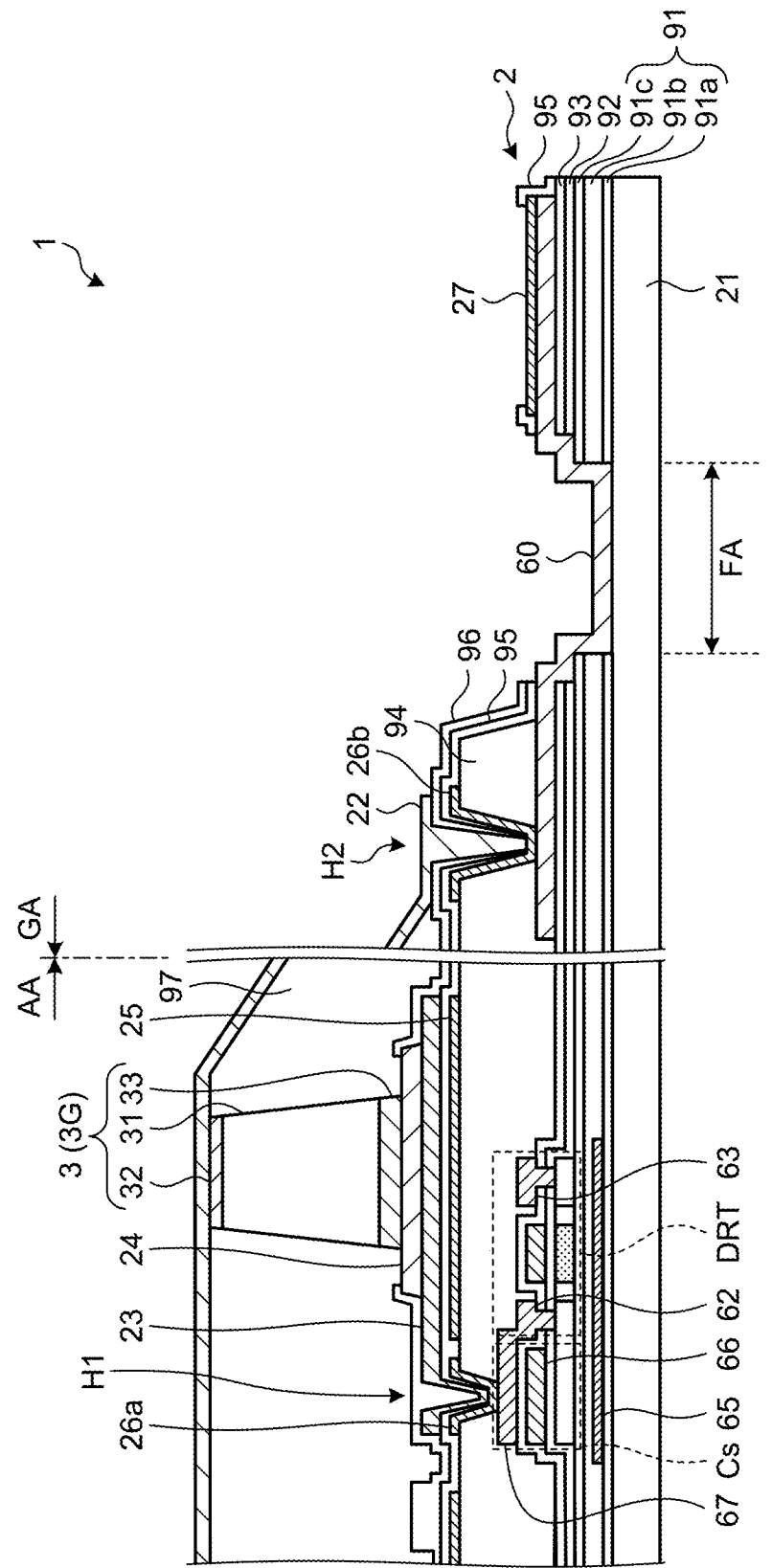
FIG. 6 is a cross-sectional view taken along line VI-VI' in FIG. 1.

Subsequently, a sectional configuration of the display device 1 will be described below. FIG. 5 is a cross-sectional view taken along line V-V' in FIG. 2. FIG. 6 is a cross-sectional view taken along line VI-VI' in FIG. 1. As illustrated in FIG. 5, each of the light emitting elements 3 is provided on the array substrate 2. The array substrate 2 includes the substrate 21, the anode electrode 23, the coupling layer 24, a counter electrode 25, a coupling electrode 26a, various transistors, various wires, and various insulating films.

The substrate 21 is an insulating substrate, and is a glass substrate made of quartz, alkali-free glass, or the like or is a resin substrate made of polyimide or the like. When a flexible resin substrate is used as the substrate 21, the display device 1 may be configured as a sheet display. The substrate 21 is not limited to polyimide but may be made of another resin material.

In the present specification, a direction from the substrate 21 toward the light emitting element 3 along a direction perpendicular to the surface of the substrate 21 is referred to as an "upper side" or simply "up". A direction from the light emitting element 3 toward the substrate 21 is referred to as a "lower side" or simply "down".

An undercoat film 91 is provided on the substrate 21. The undercoat film 91 has, for example, a three-layer multilayered structure including insulating films 91a, 91b, and 91c. The insulating film 91a is a silicon oxide film, the insulating film 91b is a silicon nitride film, and the insulating film 91c is a silicon oxide film. The insulating film 91a, which is the lower layer, is provided to improve close contact between the substrate 21 and the undercoat film 91. The insulating film 91b, which is the intermediate layer, is provided as a block film against water and impurities from the outside. The insulating film 91c, which is the upper layer, is provided as a block film that prevents hydrogen atoms contained in the silicon nitride film as the insulating film 91b from diffusing to a semiconductor layer 61 side.

The configuration of the undercoat film 91 is not limited to that illustrated in FIG. 5. For example, the undercoat film 91 may be a single-layer film or a two-layer multilayered film or may be made of four or more stacked layers. When the substrate 21 is a glass substrate, the silicon nitride film may be formed directly on the substrate 21 because the silicon nitride film has a relatively excellent close-contact property.

A light-shielding film 65 is provided on the insulating film 91a. The light-shielding film 65 is provided between the semiconductor layer 61 and the substrate 21. The light-shielding film 65 can prevent light from entering from the substrate 21 side to a channel region 61a of the semiconductor layer 61. Alternatively, the light-shielding film 65 may be formed of a conductive material and provided with predetermined potential, thereby providing a back gate effect to the drive transistor DRT. The light-shielding film 65 may be provided on the substrate 21, and the insulating film 91a may be provided over the light-shielding film 65.

The drive transistors DRT are provided on the undercoat film 91. Although the drive transistors DRT among the transistors are illustrated in FIG. 5, the light emission control transistors BCT, the initialization transistors IST, the correction transistors CCT, the write transistors SST, and the reset transistors RST provided in the peripheral region GA, which are included in the pixel circuits PIC, have multilayered structures similar to those of the drive transistors DRT.

The drive transistors DRT each include the semiconductor layer 61, a source electrode 62, a drain electrode 63, and a gate electrode 64. The semiconductor layer 61 is provided on the undercoat film 91. The semiconductor layer 61 is made of, for example, polysilicon. However, the semiconductor layer 61 is not limited thereto but may be made of a microcrystal oxide semiconductor, an amorphous oxide semiconductor, a low-temperature polysilicon, or the like. Although only the n-type TFT is described as the drive transistor DRT, a p-type TFT may be formed as well. In the n-type TFT, the semiconductor layer 61 includes the channel region 61a, a source region 61b, a drain region 61c, and a low-concentration impurity region 61d. The low-concentration impurity region 61d is provided between the channel region 61a and the source region 61b and also provided between the channel region 61a and the drain region 61c.

A gate insulating film 92 is provided on the undercoat film 91 and covers the semiconductor layer 61. The gate insulating film 92 is, for example, a silicon oxide film. The gate electrode 64 is provided on the gate insulating film 92. A first wire 66 is provided in the same layer as that the gate electrode 64 is provided in. The gate electrode 64 and the first wire 66 are made of, for example, molybdenum tungsten (MoW). In the example illustrated in FIG. 5, the drive transistor DRT has a top-gate structure in which the gate electrode 64 is provided on the upper side of the semiconductor layer 61. However, the drive transistor DRT is not limited thereto but may have a bottom-gate structure in which the gate electrode 64 is provided on the lower side of the semiconductor layer 61, or may have a dual-gate structure in which the gate electrode 64 are provided on each of the upper and lower sides of the semiconductor layer 61.

An interlayer insulating film 93 is provided on the gate insulating film 92 and covers the gate electrode 64. The interlayer insulating film 93 has, for example, a multilayered structure of a silicon nitride film and a silicon oxide film. The source electrode 62 and the drain electrode 63 are provided on the interlayer insulating film 93. The source electrode 62 is coupled with the source region 61b through a contact hole provided to the gate insulating film 92 and the interlayer insulating film 93. The drain electrode 63 is coupled with the drain region 61c through a contact hole provided to the gate insulating film 92 and the interlayer insulating film 93. A second wire 67 as a routing wire is coupled with the source electrode 62. The source electrode 62, the drain electrode 63, and the second wire 67 may employ, for example, a multilayered structure of three layers of titanium (Ti), aluminum (Al), and titanium (Ti).

Part of the second wire 67 is formed in a region overlapping with the first wire 66. The holding capacitor Cs is formed by the first wire 66 and the second wire 67 opposite to each other through the interlayer insulating film 93. The first wire 66 is formed in a region overlapping with part of the semiconductor layer 61. The holding capacitor Cs includes a capacitor formed by the semiconductor layer 61 and the first wire 66 opposite to each other through the gate insulating film 92.

A flattening film 94 is provided on the interlayer insulating film 93 and covers the drive transistor DRT and the second wire 67. The flattening film 94 is made of an organic material such as light-sensitive acrylic. The organic material such as light-sensitive acrylic is excellent in a wiring-step coverage property and a surface flattening property as compared to an inorganic insulation material formed by CVD or the like.

The counter electrode 25, a capacitor insulating film 95, the anode electrode 23, the coupling layer 24, and an anode electrode insulating film 96 are stacked in the stated order on the flattening film 94. The counter electrode 25 is made of a translucent conductive material such as indium tin oxide (ITO). The coupling electrode 26a is provided in the same layer as that the counter electrode 25 is provided in. The coupling electrode 26a covers the inside of a contact hole H1 provided to the flattening film 94 and is coupled with the second wire 67 at a bottom part of the contact hole H1.

The capacitor insulating film 95 covers the counter electrode 25 and the coupling electrode 26a and has an opening in a region overlapping with the contact hole H1. The capacitor insulating film 95 is, for example, a silicon nitride film. The anode electrode 23 is provided opposite to the counter electrode 25 through the capacitor insulating film 95. The anode electrode 23 is electrically coupled with the coupling electrode 26a and the second wire 67 through the contact hole H1. Accordingly, the anode electrode 23 is electrically coupled with the drive transistor DRT. The anode electrode 23 has a multilayered structure of molybdenum (Mo) and aluminum (Al). However, the anode electrode 23 is not limited thereto but may be made of a material containing at least one of metals of molybdenum and titanium. Alternatively, the anode electrode 23 may be made of an alloy containing at least one of molybdenum and titanium or made of a translucent conductive material.

The capacitor Cad is formed between the anode electrode 23 and the counter electrode 25 opposite to each other through the capacitor insulating film 95. The counter electrode 25 formed of ITO also functions as a barrier film for protecting various wires such as the second wire 67 in the process of forming the anode electrode 23 and the coupling layer 24. In patterning of the anode electrode 23, part of the counter electrode 25 is exposed to an etching environment, but the counter electrode 25 is given sufficient resistance against etching of the anode electrode 23 by anneal treatment performed after formation of the counter electrode 25 and before formation of the anode electrode 23.

The coupling layer 24 is provided on the anode electrode 23. The coupling layer 24 contains a plurality of conductive nanoparticles 51. The coupling layer 24 may be patterned by ink jet printing, screen printing, or the like by using conductive ink or conductive paste containing the conductive nanoparticles 51. The method of patterning the coupling layer 24 will be described later.

The anode electrode insulating film 96 covers the anode electrode 23 and the coupling layer 24. The anode electrode insulating film 96 is, for example, a silicon nitride film. The anode electrode insulating film 96 covers the peripheral part of the coupling layer 24 and insulates the coupling layer 24 from the anode electrode 23 of any adjacent sub pixels 49.

The anode electrode insulating film 96 has, at a position overlapping with the coupling layer 24, an opening OP for mounting the light emitting element 3. The opening OP has an area larger than that of the light emitting element 3 based on consideration of a mounting error amount or the like in the process of mounting the light emitting element 3. In other words, the area of the coupling layer 24 is larger than that of the light emitting element 3 in a plan view in a direction perpendicular to the substrate 21. The area of the anode electrode 23 is larger than that of the light emitting element 3 in a plan view in the direction perpendicular to the substrate 21. The light emitting element 3 includes at least two terminals (the anode terminal 33 and the cathode terminal 32), and the area of the anode electrode 23 is larger than that of one of the at least two terminals (the anode terminal 33 and the cathode terminal 32) in a plan view in the direction perpendicular to the substrate 21. For example, when the light emitting element 3 has a mounting area of 10 μm×10 μm approximately in a plan view, the opening OP preferably has an area of 20 μm×20 μm approximately.

Each of the light emitting elements 3R, 3G, and 3B is mounted on the corresponding anode electrode 23 through the coupling layer 24. In other words, the coupling layer 24 is provided between the anode electrode 23 and the light emitting element 3 in the direction perpendicular to the substrate 21. The light emitting element 3 includes a semiconductor layer 31, the cathode terminal 32, and the anode terminal 33. The semiconductor layer 31 may employ a configuration in which an n-type clad layer, an active layer, and a p-type clad layer are stacked.

The semiconductor layer 31 is made of, for example, a compound semiconductor such as nitridation gallium (GaN) or aluminum indium phosphorus (AlInP). The semiconductor layer 31 may be made of a material different for each of the light emitting elements 3R, 3G, and 3B. For high efficiency, the active layer may have a multiple quantum well structure (MQW structure) in which a well layer and a barrier layer, each made of several atom layers, are periodically stacked. The light emitting element 3 may have a configuration in which the semiconductor layer 31 is formed on a semiconductor substrate. Alternatively, the present disclosure is not limited to a configuration in which the light emitting element 3 is mounted on the array substrate 2, but an LED chip including the light emitting element 3 may be mounted on the array substrate 2. The LED chip includes, for example, a light emitting element substrate, the light emitting element 3 provided on the light emitting element substrate, and circuit elements provided on the light emitting element substrate and configured to drive the light emitting element 3. The LED chip exemplarily has a configuration in which the light emitting element substrate, the light emitting element 3, and the circuit elements are integrated to one chip. A plurality of light emitting elements 3 may be provided on the LED chip and may emit light in colors different from each other.

The light emitting element 3 is mounted so that the anode terminal 33 contacts the coupling layer 24. Accordingly, the anode electrode 23 is electrically coupled with the light emitting element 3 through the coupling layer 24. An element insulating film 97 is provided among a plurality of light emitting elements 3. The element insulating film 97 is formed of a resin material. The element insulating film 97 covers the side surface of the light emitting element 3, and the cathode terminal 32 of the light emitting element 3 is exposed out of the element insulating film 97. The element insulating film 97 is formed flat so that the upper surface of the element insulating film 97 and the upper surface of the cathode terminal 32 form the same surface. However, the position of the upper surface of the element insulating film 97 may be different from the position of the upper surface of the cathode terminal 32.

The cathode electrode 22 is provided across the upper surface of the element insulating film 97 and the upper surface of the cathode terminal 32. The cathode electrode 22 is made of a translucent conductive material such as ITO. Accordingly, light emitted from the light emitting element 3 can be efficiently extracted. The cathode electrode 22 is electrically coupled with the cathode terminals 32 of the light emitting elements 3 mounted in the display region AA.

As illustrated in FIG. 6, at a cathode contact part (contact hole H2) provided outside the display region AA, the cathode electrode 22 is coupled with the cathode wire 60 provided on the array substrate 2 side. FIG. 6 illustrates the peripheral region GA and the display region AA together to facilitate understanding of the correspondence relation between a sectional configuration of the peripheral region GA and a sectional configuration of the display region AA.

As illustrated in FIG. 6, the display device 1 includes a terminal part 27, a bending region FA, and the cathode contact part (contact hole H2) in the peripheral region GA. The terminal part 27 is a terminal coupled with the drive IC 210 or a wiring substrate such as a flexible printed board. The bending region FA is a region of the array substrate 2 for bending the peripheral region GA on the terminal part 27 side. When the bending region FA is provided, the substrate 21 is made of a flexible resin material.

Specifically, the undercoat film 91, the gate insulating film 92, and the interlayer insulating film 93 are provided across the display region AA and the peripheral region GA to the end part of the substrate 21. The undercoat film 91, the gate insulating film 92, and the interlayer insulating film 93 are removed in the bending region FA. The undercoat film 91, the gate insulating film 92, and the interlayer insulating film 93 are removed by etching in the bending region FA. In this case, the surface of the substrate 21 made of a resin material such as polyimide is partially eroded due to etching and a recess is formed in some cases.

The cathode wire 60 is provided on the interlayer insulating film 93. Specifically, the cathode wire 60 is provided in the same layer as that the source electrode 62, the drain electrode 63, and the second wire 67 are provided in, and formed of the same material thereof. The cathode wire 60 is provided across the bending region FA along a step formed by the undercoat film 91, the gate insulating film 92, the interlayer insulating film 93, and the substrate 21. The cathode wire 60 is provided on the substrate 21 in the bending region FA and provided on the interlayer insulating film 93 between the bending region FA and the end part of the substrate 21.

The flattening film 94 is removed in the bending region FA and a region between the bending region FA and the end part of the substrate 21 in the peripheral region GA. The flattening film 94 is provided with the contact hole H2 in a region between the bending region FA and the display region AA. The cathode wire 60 is exposed at the bottom surface of the contact hole H2, and the element insulating film 97 is provided so that the thickness of the element insulating film 97 decreases from the peripheral part of the display region AA toward the peripheral region GA. The cathode wire 60 is electrically coupled with the cathode electrode 22 through a coupling electrode 26b provided inside the contact hole H2. The coupling electrode 26b is provided in the same layer as that the counter electrode 25 and the coupling electrode 26a are provided in, and formed of the same material as that of the counter electrode 25 and the coupling electrode 26a.

The terminal part 27 is provided on the cathode wire 60 in the region between the bending region FA and the end part of the substrate 21. The capacitor insulating film 95 covers the terminal part 27 and has an opening in a region overlapping with the terminal part 27.

The display device 1 including the light emitting elements 3 as display elements is configured as described above. The display device 1 may be provided with a cover glass, a touch panel, or the like on the upper side of the cathode electrode 22 as necessary. In this case, a filling material such as resin may be provided between the display device 1 and a member such as a cover glass. The display device 1 is not limited to a face-up structure in which an upper part of each of the light emitting elements 3 is coupled with the cathode electrode 22, but may have what is called a face-down structure in which a lower part of the light emitting element 3 is coupled with the anode electrode 23 and the cathode electrode 22.

Figure 7:
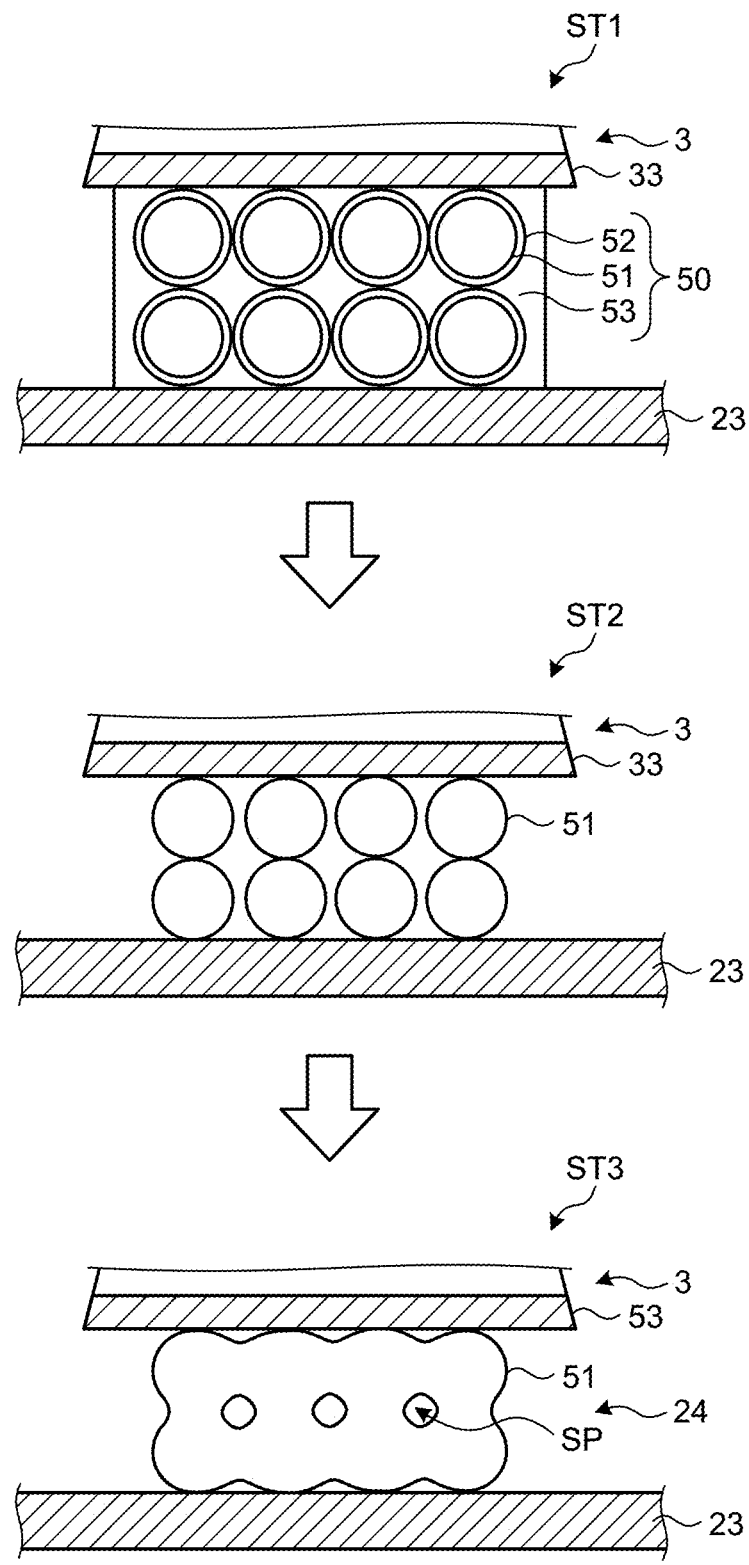
FIG. 7 is an explanatory diagram for description of the process of coupling a light emitting element and an anode electrode.

Subsequently, the method of coupling the light emitting element 3 and the anode electrode 23 will be described below. FIG. 7 is an explanatory diagram for description of the process of coupling the light emitting element and the anode electrode. FIG. 7 only illustrates part of the light emitting element 3 on the anode terminal 33 side.

As illustrated in FIG. 7, an application film 50 is formed on the anode electrode 23, and the anode terminal 33 of the light emitting element 3 contacts the application film 50 from above (step ST1). The application film 50 is formed by printing by using conductive paste or conductive ink obtained by dispersing the conductive nanoparticles 51 in a solvent 53. The application film 50 may be formed by screen printing, flexographic printing, or ink jet printing.

A coat 52 of an organic resin material is formed on the surface of each of the conductive nanoparticles 51. Accordingly, the anode electrode 23 and the anode terminal 33 are in a non-conduction state due to the coat 52.

Subsequently, the coat 52 is disassembled and removed by providing heating treatment to the application film 50 (step ST2). Accordingly, the surfaces of the conductive nanoparticles 51 contact each other.

Heating is further performed to sinter the conductive nanoparticles 51 and form the coupling layer 24 (step ST3). Accordingly, the anode electrode 23 and the anode terminal 33 are electrically coupled with each other through the coupling layer 24.

Each of the conductive nanoparticles 51 is, for example, silver (Ag) or a silver alloy. Each of the conductive nanoparticles 51 has a particle size in the nano order (for example, 1 nm to 30 nm inclusive approximately) and has high surface energy. Thus, the conductive nanoparticles 51 can be sintered, for example, at a temperature lower than the temperature of a reflow process using a soldering material and the temperature of normal sintering of conductive paste containing silver powder (having, for example, a particle size of 1 μm or larger). Accordingly, it is possible to reduce the difference between the contraction amount of each of the light emitting elements 3 and the contraction amount of the coupling layer 24 at cooling in the process of coupling the light emitting elements 3. This leads to reduction of residual stress at a coupling part between the light emitting element 3 and the anode electrode 23 after the cooling.

As illustrated in FIG. 7, a plurality of minute void spaces SP are formed among the conductive nanoparticles 51 inside the coupling layer 24 after the sintering. Thus, residual stress that occurs to the coupling layer 24 can be reduced. As a result, the display device 1 can have improved reliability of coupling between the array substrate 2 and each of the light emitting elements 3. When the display device 1 is configured as a curved surface display, the array substrate 2 has a curved surface. In this case as well, the coupling layer 24 can reduce stress that occurs to the coupling part between the light emitting element 3 and the anode electrode 23, thereby improving the reliability of coupling between the light emitting element 3 and the array substrate 2.

The particle size of each of the conductive nanoparticles 51 used as the material of the coupling layer 24 can be measured by, for example, a laser diffraction scattering method. As described above, the coupling layer 24 can be patterned by a printing method such as screen printing, flexographic printing, or ink jet printing. However, the present disclosure is not limited thereto but various kinds of methods may be applied to the patterning of the coupling layer 24.

Figure 8:
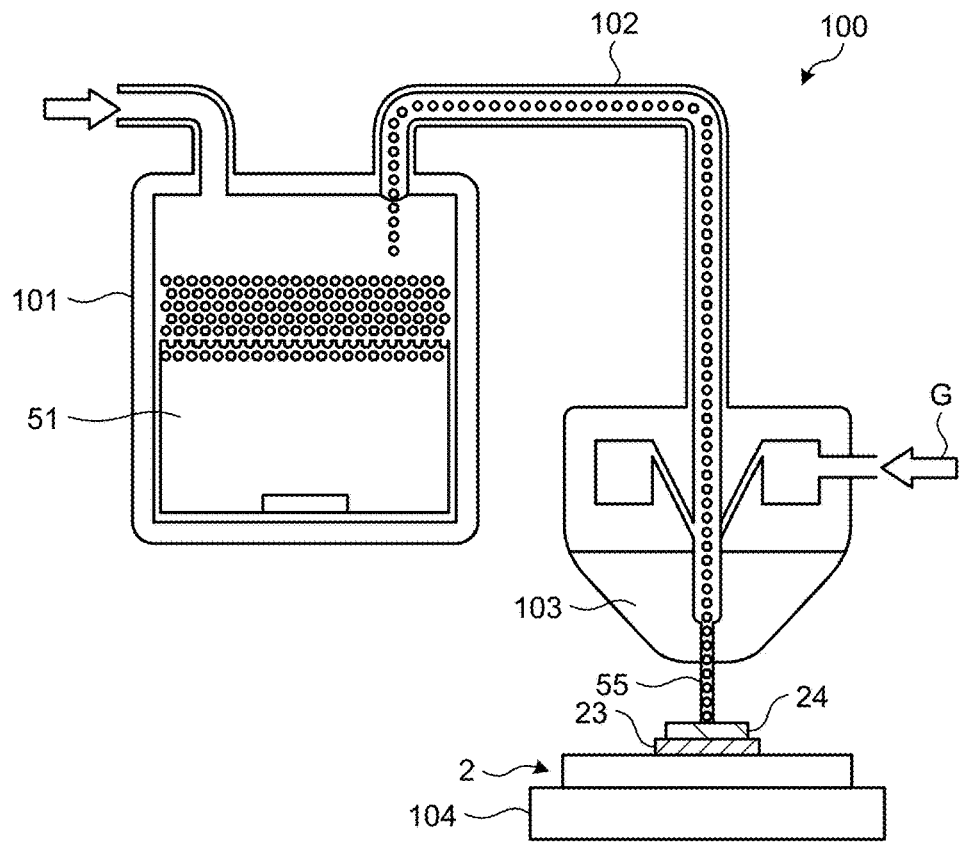
FIG. 8 is an explanatory diagram for description of a coupling-layer patterning method.

FIG. 8 is an explanatory diagram for description of the coupling-layer patterning method. As illustrated in FIG. 8, a deposition device 100 includes an aerosol generation device 101, a pipe 102, a nozzle 103, and an XY stage 104. The deposition device 100 can form the coupling layer 24 by an aerosol deposition method. Conductive nanoparticles 51 as a material are input to the aerosol generation device 101. The conductive nanoparticles 51 are aerosolized through agitation and mixing in the aerosol generation device 101. These aerosol particles are densified through the pipe 102 and conveyed to the nozzle 103. The aerosol particles conveyed to the nozzle 103 are accelerated by carrier gas G. Accordingly, an aerosol beam 55 is emitted toward the array substrate 2 through an opening of the nozzle 103.

As the aerosol particles collides the anode electrode 23 of the array substrate 2, the aerosol particles are connected with the anode electrode 23 and connected with one another. As a result, the deposition device 100 can form the coupling layer 24 on the anode electrode 23. The deposition device 100 can also form the coupling layer 24 in a predetermined pattern by driving the XY stage 104. In this manner, the deposition device 100 can directly form the coupling layer 24 on the anode electrode 23 with the aerosolized conductive nanoparticles 51.

Figure 9:
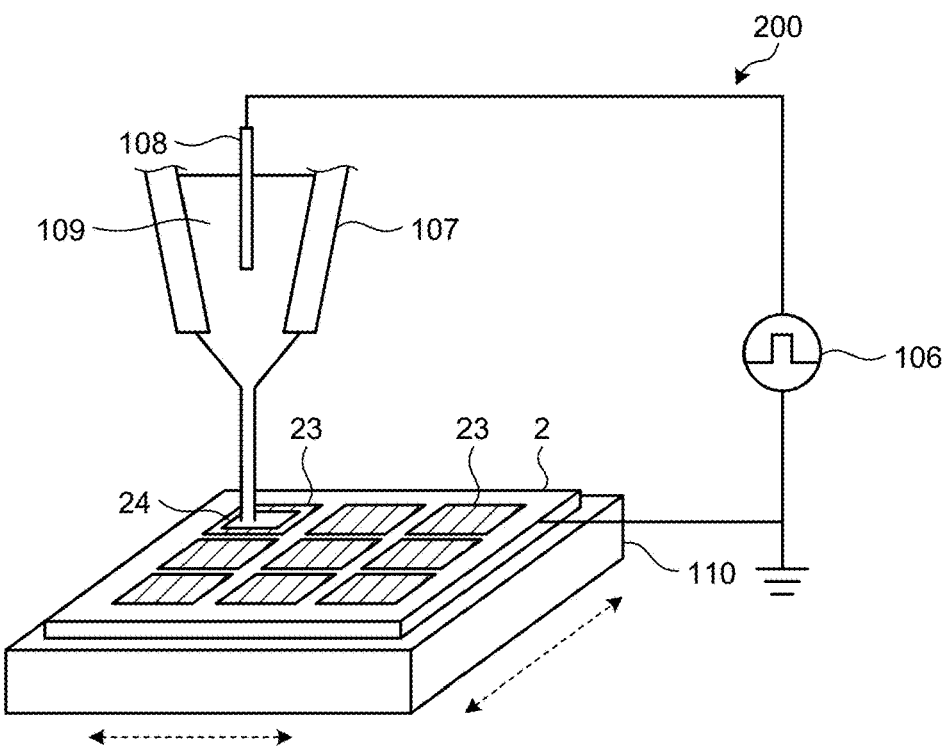
FIG. 9 is an explanatory diagram for description of a first modification of the coupling-layer patterning method.

FIG. 9 is an explanatory diagram for description of a first modification of the coupling-layer patterning method. A deposition device 200 includes a power source 106, a nozzle 107, an electrode 108, and an XY stage 110. The deposition device 200 can form the coupling layer 24 by an electrostatic application method. Solution 109 in which conductive nanoparticles 51 are dispersed is input into the nozzle 107. The electrode 108 is provided in the nozzle 107 and contacts the solution 109. The power source 106 applies high voltage of positive polarity between the array substrate 2 and the solution 109 in the nozzle 107.

Positive electric charge occurs to the solution 109 at a leading end part of the nozzle 107, and negative electric charge occurs to the array substrate 2 side. Part of the solution 109 is emitted toward the array substrate 2 by electrostatic force generated between the solution 109 and the array substrate 2. The conductive nanoparticles 51 in the solution 109 are attracted onto the anode electrode 23 by the electrostatic force, thereby forming the coupling layer 24. The deposition device 200 can adjust the amount, shape, or the like of the solution 109 emitted from the nozzle 107 by changing the voltage applied by the power source 106. Accordingly, the deposition device 200 can pattern the coupling layer 24 into a minute shape.

Figure 10:
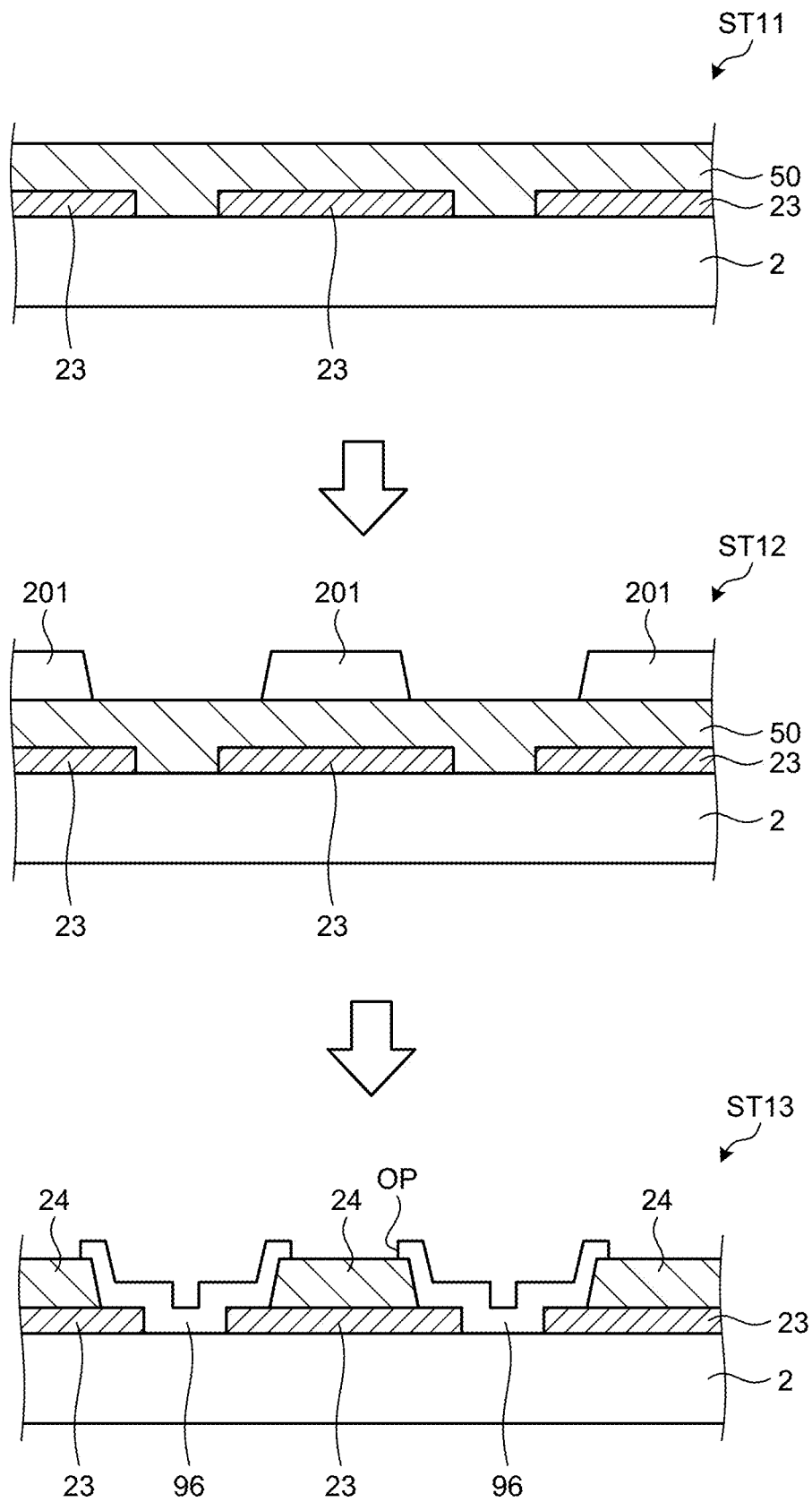
FIG. 10 is an explanatory diagram for description of a second modification of the coupling-layer patterning method.

FIG. 10 is an explanatory diagram for description of a second modification of the coupling-layer patterning method. In the second modification, the coupling layer 24 is formed by a photolithography technique. As illustrated in FIG. 10, a deposition device applies and forms the application film 50 containing conductive nanoparticles 51 onto the entire surface of the array substrate 2 (step ST11). The application film 50 is formed to cover a plurality of anode electrodes 23. The application film 50 is provided with heating treatment to remove the coat 52 covering the surface of each of the conductive nanoparticles 51 and the solvent 53 (refer to FIG. 7). In this case, the heating treatment is provided at a temperature lower than the sintering temperature of the conductive nanoparticles 51. Accordingly, the conductive nanoparticles 51 are accumulated on the array substrate 2.

Subsequently, the deposition device forms a resist 201 on a plurality of conductive nanoparticles 51 in a region overlapping with each anode electrode 23, in other words, a region in which each coupling layer 24 is to be provided (step ST12).

Subsequently, the deposition device removes, by etching, a plurality of conductive nanoparticles 51 in a region not overlapping with the resist 201 (step ST13). Since the conductive nanoparticles 51 are not sintered yet in a state at step ST12, the etching rate of the conductive nanoparticles 51 is higher than that of the anode electrode 23. Accordingly, the coupling layer 24 containing the conductive nanoparticles 51 are formed on the anode electrode 23. Thereafter, the anode electrode insulating film 96 is formed to cover the coupling layer 24 and the anode electrode 23. The opening OP is formed through the anode electrode insulating film 96 in a region overlapping with the coupling layer 24.

In the second modification, since the coupling layer 24 is formed by a photolithography technique as described above, the coupling layer 24 can be formed through the same process as the process of manufacturing the array substrate 2. Thus, the manufacturing cost of the display device 1 can be reduced.

Second Embodiment

Figure 11:
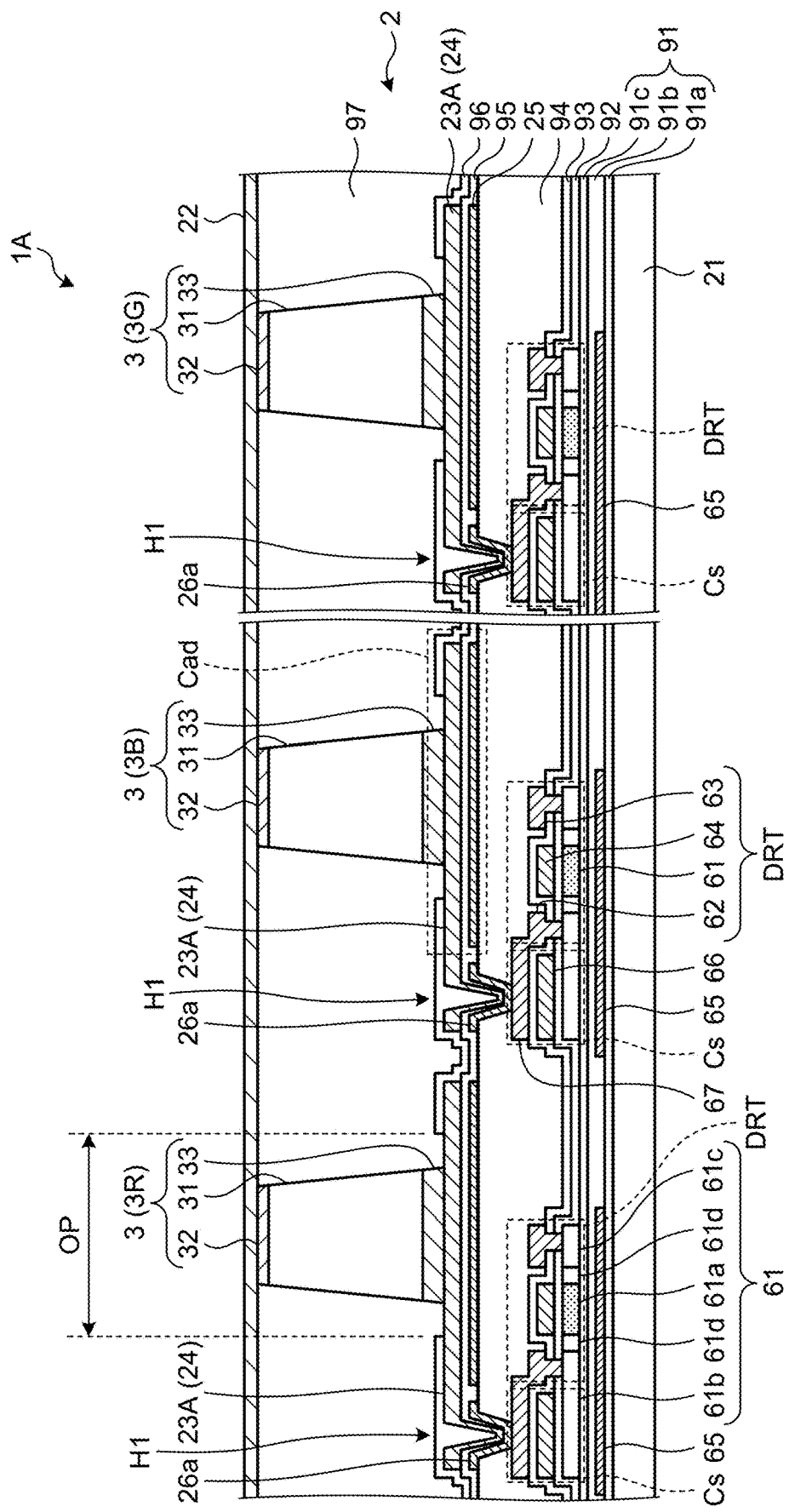
FIG. 11 is a cross-sectional view illustrating a display device according to a second embodiment.

FIG. 11 is a cross-sectional view illustrating a display device according to a second embodiment. In the following description, any component same as that described above in the embodiment is denoted by the same reference sign and duplicate description thereof is omitted.

Unlike the first embodiment, a display device 1A according to the second embodiment has a configuration in which an anode electrode 23A is formed of a plurality of conductive nanoparticles 51. The anode terminal 33 of each of the light emitting elements 3 is coupled on the corresponding anode electrode 23A. In other words, the anode electrode 23A also functions as the coupling layer 24.

In the second embodiment as well, since the conductive nanoparticles 51 are contained in the anode electrode 23A, the conductive nanoparticles 51 can be sintered at low temperature to couple the anode electrode 23A and the light emitting element 3. Accordingly, residual stress at a coupling part between the light emitting element 3 and the anode electrode 23A can be reduced. Since the anode electrode 23A also functions as the coupling layer 24, the display device 1A can have a reduced number of staked layers on the array substrate 2 compared to that in the first embodiment.

In the second embodiment, the method of coupling the anode electrode 23A and the light emitting element 3 and the method of patterning the anode electrode 23A may be the same as those in the first embodiment and the modifications described above.

Third Embodiment

Figure 12:
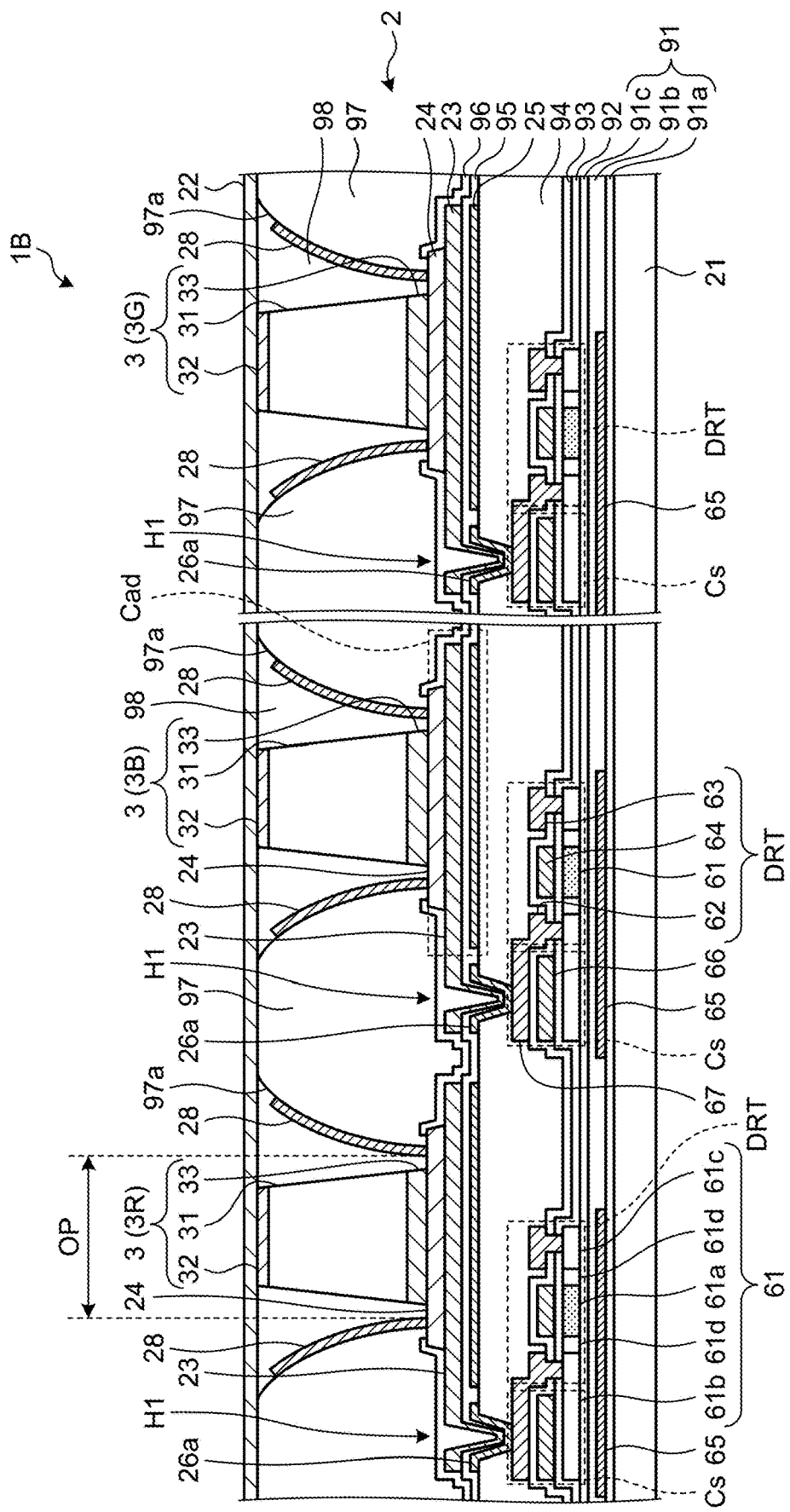
FIG. 12 is a cross-sectional view illustrating a display device according to a third embodiment.

FIG. 12 is a cross-sectional view illustrating a display device according to a third embodiment. Unlike the above-described embodiment, this display device 1B according to the third embodiment includes a reflective layer 28. As illustrated in FIG. 12, the reflective layer 28 is provided facing the side surface of the corresponding light emitting element 3 and contains a plurality of conductive nanoparticles 51.

More specifically, the element insulating film 97 is provided with a through-hole 97a in a region overlapping with the light emitting element 3. The light emitting element 3 is surrounded by the inner wall of the through-hole 97a and disposed on the coupling layer 24. The reflective layer 28 is provided along the inner wall of the through-hole 97a. The lower end of the reflective layer 28 is electrically coupled with the anode electrode 23 through the coupling layer 24. The upper end of the reflective layer 28 is separated from the cathode electrode 22. In the present embodiment, the area of the opening OP for mounting the light emitting element 3 is that of a region surrounded by the lower end of the reflective layer 28.

A reflective-layer insulating film 98 is provided inside the through-hole 97a. The reflective-layer insulating film 98 covers the side surface of the light emitting element 3 and also covers the reflective layer 28. The cathode electrode 22 covers the element insulating film 97, the reflective-layer insulating film 98, and the light emitting element 3 and is electrically coupled with the cathode terminal 32. The reflective-layer insulating film 98 is also provided between the upper end of the reflective layer 28 and the cathode electrode 22.

The reflective layer 28 is formed of a plurality of shiny conductive nanoparticles 51. The reflective layer 28 is tilted relative to the normal direction of the substrate 21. Accordingly, the reflective layer 28 reflects light emitted in the lateral direction (side surface direction) among light emitted from the light emitting element 3, and emits the reflected light in a direction along the normal direction of the substrate 21. With this configuration, the display device 1B can have improved efficiency of extraction of light from the light emitting element 3.

The reflective layer 28 may be provided around the light emitting element 3 or may be provided facing part of the side surface of the light emitting element 3. The configuration of the second embodiment may be applied to the display device 1B.

Fourth Embodiment

Figure 13:
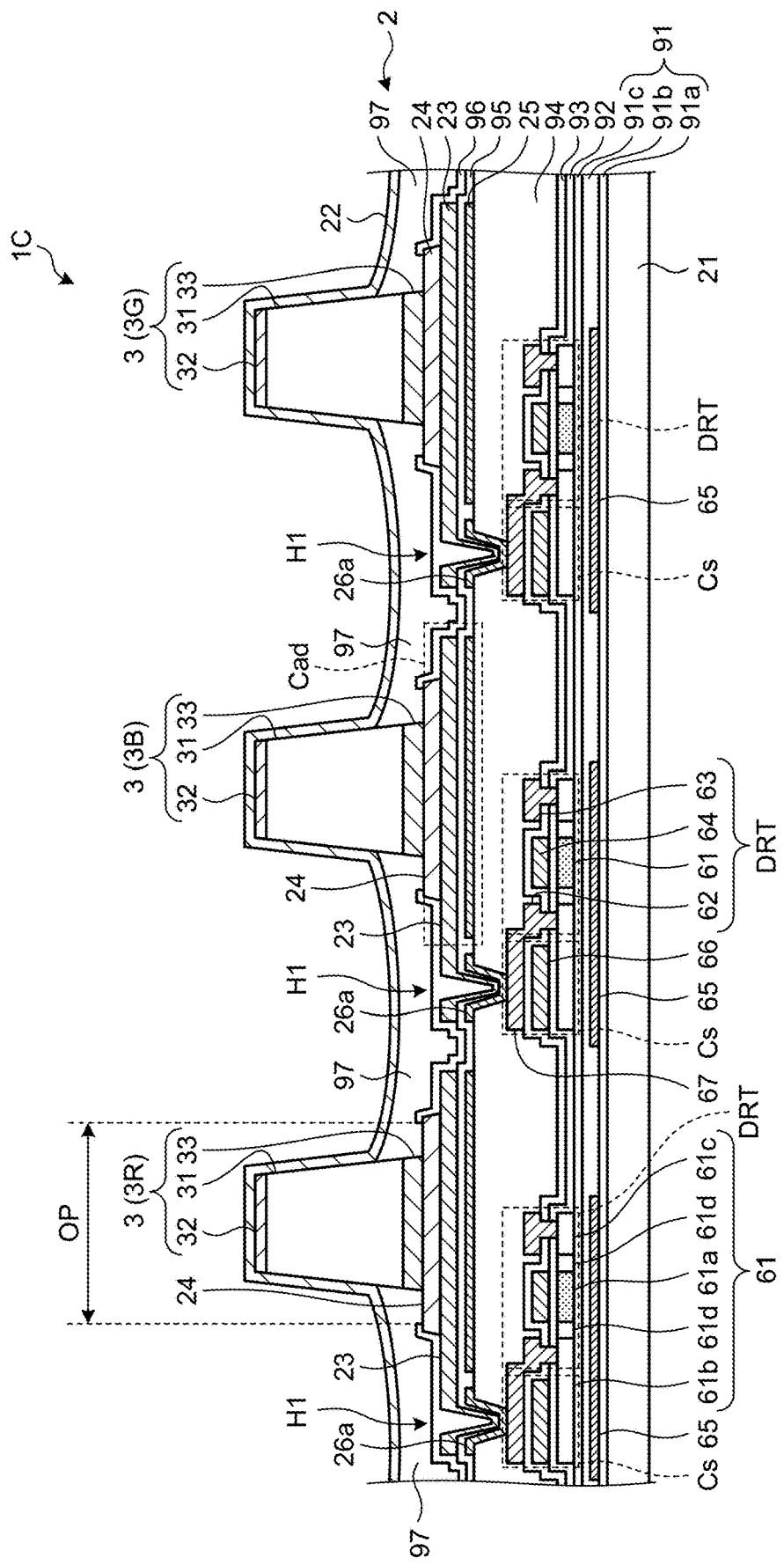
FIG. 13 is a cross-sectional view illustrating a display device according to a fourth embodiment.

FIG. 13 is a cross-sectional view illustrating a display device according to a fourth embodiment. In the first to third embodiments described above, the element insulating film 97 is provided so that the upper surface of the element insulating film 97 and the upper surface of the cathode terminal 32 form the same surface, but the present disclosure is not limited thereto. As illustrated in FIG. 13, the height of the element insulating film 97 is smaller than the height of each of the light emitting elements 3 in a display device 1C according to the fourth embodiment.

The element insulating film 97 covers each anode electrode 23 and each coupling layer 24. In addition, the element insulating film 97 covers part of the side surface of each of the light emitting elements 3 and covers at least the side surface of each anode terminal 33. The cathode electrode 22 covers the upper surface of the element insulating film 97, the cathode terminal 32 of each of the light emitting elements 3, and part of the side surface of each of the light emitting elements 3.

In the fourth embodiment as well, the element insulating film 97 can provide insulation between the anode electrodes 23 in the sub pixels 49 adjacent to each other. The element insulating film 97 can also provide the strength of coupling between each of the light emitting elements 3 and the corresponding anode electrode 23. The configuration of the second embodiment may be applied to the display device 1C.

Parts described above as the anode terminal 33 and the cathode terminal 32 are not limited to the configuration described in the specification but may be interchanged depending on the coupling direction of the light emitting element 3 and the direction of voltage application. For example, FIGS. 5, 11, and 12 illustrate a configuration in which one electrode of the light emitting element 3 is positioned on the lower side and the other electrode is positioned on the upper side, but both electrodes may be positioned on the lower side, in other words, on a side opposite to the array substrate 2.

The preferable embodiments of the present disclosure are described above, but the present disclosure is not limited to such embodiments. Contents disclosed in the embodiments are merely exemplary and may be modified in various kinds of manners without departing from the scope of the present disclosure. Any modification performed as appropriate without departing from the scope of the present disclosure belongs to the technical scope of the present disclosure. At least one of various kinds of omission, replacement, and change of components may be performed without departing from the scope of the above-described embodiments and modifications.

What is claimed is:

1. A display device comprising:
a substrate;
a plurality of pixels on the substrate;
a light emitting element in each of the plurality of pixels;
a first electrode electrically coupled with the light emitting element;
a transistor on the substrate and electrically coupled with the first electrode; and
a coupling layer between the first electrode and the light emitting element in a direction perpendicular to the substrate and containing a plurality of first conductive nanoparticles.

2. The display device according to claim 1, wherein the first conductive nanoparticles are spaced apart from one another.

3. The display device according to claim 1, wherein an area of the first electrode is larger than an area of the light emitting element in a plan view in the direction perpendicular to the substrate.

4. The display device according to claim 1, wherein
the light emitting element includes at least two terminals, and
an area of the first electrode is larger than an area of one of the at least two terminals in a plan view in the direction perpendicular to the substrate.

5. The display device according to claim 1, further comprising a reflective layer facing a side surface of the light emitting element and containing a plurality of second conductive nanoparticles.

6. The display device according to claim 5, further comprising:
an element insulating film among the light emitting elements and including through-holes at positions overlapping with the respective light emitting elements; and
a second electrode covering the light emitting elements and the element insulating film and electrically coupled with the light emitting elements, wherein
the reflective layer is on an inner wall of the corresponding through-hole.

7. The display device according to claim 6, wherein the reflective layer has a lower end electrically coupled with the first electrode and has an upper end separated from the second electrode.

8. The display device according to claim 1, further comprising:
an element insulating film among the light emitting elements and covering at least part of a side surface of each of the light emitting elements; and
a second electrode covering the light emitting elements and the element insulating film and electrically coupled with the light emitting elements, wherein
a height of each of the light emitting elements is greater than a height of the element insulating film.

9. The display device according to claim 1, wherein the first conductive nanoparticles include silver or a silver alloy.

10. The display device according to claim 5, wherein the second conductive nanoparticles include silver or a silver alloy.

11. The display device according to claim 1, wherein the first electrode contains at least one of metals of molybdenum and titanium, an alloy including at least one of the metals, or a translucent conductive material.

12. The display device according to claim 1, wherein the first electrode contains a plurality of first conductive nanoparticles.

13. The display device according to claim 1, further comprising a plurality of chip components each including:
a light emitting element substrate;
at least one of the light emitting elements on the light emitting element substrate; and
at least one circuit element on the light emitting element substrate and configured to drive the at least one of the light emitting elements, wherein
the chip components are arranged in an array on the substrate.

14. The display device according to claim 13, wherein each of the chip components includes the light emitting elements configured to emit light beams of different kinds.

* * * * *